Sept. 28, 1965 G. ZIEGLER ETAL 3,208,888
PROCESS OF PRODUCING AN ELECTRONIC SEMICONDUCTOR DEVICE
Filed June 9, 1961 2 Sheets-Sheet 1
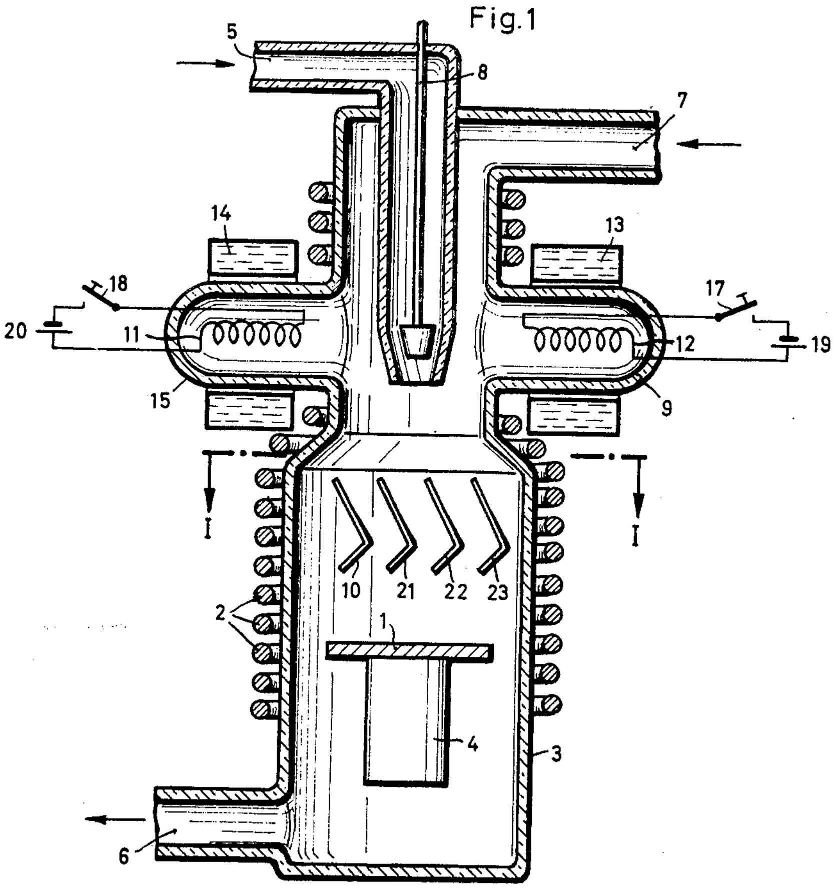
Fig. 2
I÷I
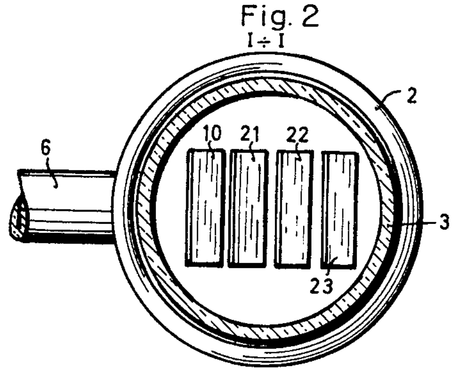

3,208,888

PROCESS OF PRODUCING AN ELECTRONIC SEMICONDUCTOR DEVICE

Günther Ziegler and Günther Winstel, Munich, Germany, assignors to Siemens and Halske Aktiengesellschaft, Berlin, Germany, a corporation of Germany Filed June 9, 1961, Ser. No. 116,039
Claims priority, application Germany, June 13, 1960, S 68,909
14 Claims. (Cl. 148—175)

Our invention relates to a process for the production of electronic semiconductor devices with at least one p-n junction on pyrolytic or epitaxial principles, namely by thermal decomposition of a gaseous compound of the semiconductor material which, together with an inert gas such as hydrogen, is passed over a carrier body heated to pyrolytic temperature so that the semiconductor material precipitates upon the carrier body and increases its thickness. In a more particular, although not exclusive aspect, our invention relates to the production of tunnel diodes by such epitaxial methods.

According to known methods for producing germanium and silicon layers upon a carrier of the same material, a thin germanium or silicon layer is pyrolytically dissociated from a gaseous germanium or silicon halogenide, for example iodide, and is precipitated upon the carrier which, though consisting of the same semiconductor material, has different conductance, preferably opposed type. This epitaxial method is suitable for the production of single or multiple p-n junction devices. For obtaining a satisfactory and uniform growth of the precipitating semiconductor material in form of a monocrystalline layer, it is further known to subject the surface of the monocrystalline carrier body, before performing the pyrolytic reaction, to an etching or polishing treatment. In some cases, the etched body was further treated with hydrofluoric acid shortly before introducing the carrier body into the reaction apparatus, and thereafter the treated carrier was subjected to vaporization or spattering in high vacuum or in a suitable protective gas such as hydrogen, in order to purify the body by removing therefrom any oxidic impurities as may have been formed in the meantime by exposure to the atmosphere.

These known methods have the shortcoming that, during growth of the individual precipitation layers, the p-n junction becomes broadened due to diffusion thus flattening the p-n gradient of the junction.

It is an object of our invention to devise a pyrolytic or epitaxial method generally of the above-mentioned kind, which avoids such flattening of the p-n junction during growth of the individual layers by pyrolytic precipitation from the gaseous phase. Another object of the invention, akin to the one just mentioned, is to provide a method which reliably affords the production of steep-gradient p-n junctions in semiconductor devices.

A steep p-n junction, i.e. an extremely narrow width of the junction zone within the semiconductor body, is particularly important for tunnel diodes. A tunnel diode is a semiconductor dipole in which the charge-carrier transportation through the p-n junction is based upon the quantum-mechanical tunnel effect. The current-voltage characteristic of such a device exhibits a range of negative resistance in the forward direction. Tunnel diodes are used, for example, for oscillations generation and amplification, particularly in the range of very high frequencies. For proper performance of a tunnel diode it is essential that the p-n junction-forming regions are so highly doped as to be degenerated, and that the change at the p-n junction from one type of doping to the other is as abrupt as possible. The upper limit frequency of such devices is dependent upon the series resistance in the current paths which resistance, in turn, depends upon the mobility of the charge carriers, the limit frequency being higher with a higher mobility. It is therefore unfavorable to produce the p-n junction by counter-doping of a p-type or n-type region doped up to degenerated constitution, such counter-doping occurring, for example when producing the junction by the alloying method. Any such counter-doping greatly reduces the mobility of the charge carriers which has the largest value when the crystal lattice is undisturbed.

For the various purposes of tunnel diodes it is of advantage to provide for a given path-characteristic of doping. For example, high doping in the p-n junction results in high tunnel-effect current but has the disadvantage of increasing the capacitance. The required doping in the path region is guided from an entirely different viewpoint. For most applications, the attainment of a small path resistance is desirable. Consequently for optimal design of a tunnel diode, the dope concentration characteristic along the current-flow path constitutes a complicated function.

It is therefore, a more specific object of our invention to devise a production method that not only affords any desired selection of the dope concentration characteristic but also avoids appreciable counter doping and produces an extremely steep doping gradient in the junction region.

For these reasons, the method according to our invention is particularly suitable for the production of tunnel diodes and is described in the following mainly with reference to the manufacture of such diodes. However, the invention is also applicable to advantage for the production of any other semiconductor components, such as transistors and ordinary diodes, particularly for high-frequency purposes in which a steep p-n junction is desired but the doping of the p-type and n-type regions is far below degenerating concentration. The supply of dope substance (lattice deflection atoms) during pyrolytic precipitation is then to be kept correspondingly smaller.

To achieve the above-mentioned objects, and in accordance with a feature of our invention, we conduct the pyrolytic or epitaxial production process in the following manner. We sequentially precipitate pyrolytically at least two semiconductor layers of mutually opposed conductance type but approximately the same lattice-defect (dope) concentration, and we thus give each of the two layers a thickness not larger than about 500 angstrom (A.) but larger than the thickness of the region which, due to diffusion during precipitation, is counter-doped up to the half-value of concentration of the majority charge carriers. After precipitating one of these very thin layers having a given conductance type, the pyrolytic precipitation process is interrupted for a short interval of time before precipitating the next layer of the other conductance type. The interruption of the precipitating and crystal growing process is effected by reducing the processing temperature, or by changing the composition of the reaction gas mixture, or simultaneously by both expedients.

For obtaining a steep p-n junction, the thickness of the zones in which during precipitation a counter doping up to the half-value of concentration of the majority charge carriers occurs by diffusion, must be kept as slight as possible. Since the method according to the invention involves the production of layers whose thickness, for example, is at about 100 A. and in any event is not larger than about 500 A., the precipitation temperature at the carrier body can be kept very low, namely equal or not far above the dissociation temperature of the gaseous semiconductor compound being used, and the precipitation periods can nevertheless be kept short, for example at one or only a few seconds. The low precipitation temperature and the short precipitation period result in a slight thickness, in order of 10 to 15 A., of the zones in the p region and n region which by diffusion become counter-doped up to the concentration half-value. Hence a very steep p-n junction is produced. The precipitation period and precipitation temperature and therefore also the thickness of the first precipitated layer are without significance to the steepness of the p-n junction. However, it is also important, particularly for tunnel diodes, to keep the junction zone extremely thin, for example about 100 A., because then the capacitance of the device can be kept very slight. When using the method for producing a tunnel diode, the dope concentration of the two junction-forming layers is above the degenerating limit (N), for example in germanium or silicon it is above $N \approx 10^{19}$ atoms per $cm.^3$ and preferably near or at the limit of solubility.

The formation of steep p-n junctions is promoted by the additional use of a gaseous semiconductor compound having a relatively low dissociation temperature, for example a gaseous hydrogen compound of the semiconductor substance to be precipitated. Thus, when producing semiconductor devices of silicon, it is of advantage to add additional monosilane ($SiH_4$) which becomes dissociated at about 800° C. Analogously, when producing semiconductor devices of germanium, germanium hydride ($GeH_4$) may be added to the reaction gas proper.

Upon completion of the junction semiconductor, the contacting of the thin layers can be effected, for example, by vapor deposition of a contact metal. However, the metal contact can also be produced in the same apparatus that is used for pyrolytic precipitation of the semiconductor layers. For this purpose a gaseous compound of the contact metal can be thermally (pyrolytically) decomposed and precipitated upon the last precipitated semiconductor layer. Another way, also applicable in the same pyrolytic apparatus, is to precipitate and grow the first thin semiconductor layer upon a carrier body of metal. Both expedients of contacting the semiconductor body may be used in the production of one and the same semiconductor device.

For reliably securing a monocrystalline growth of the semiconductor layers, it is preferable, according to another feature of our invention, to precede the pyrolytic precipitation of the first thin layer by the precipitation of a thicker and preferably monocrystalline base layer which has a greater lattice-defect (dope-atom) density than the subsequently produced thin layer and consists of the same semiconductor material as the latter. The base layer may have a thickness 10 to 20 times that of the thin layer. The pyrolytic precipitation temperature for production of the thick base layer may be kept higher than the precipitation temperature for the thin layer, the growing time, too, being not critical.

In accordance with a further feature of our invention, another thick layer, having about 10 to 20 times the thickness of the thin layer and a greater lattice-defect density than the latter, is precipitated after completing the precipitation of the thin layers. The precipitation of this thick top layer is preferably effected with reduced precipitation temperature and/or a change in composition of the reaction gas mixture. In order to best preserve the steepness of the p-n junction, the precipitation temperature when growing the thick top layer upon the thin junction-forming layers must be chosen as low as feasible; that is, it should be substantially equal to, or not substantially higher than, the dissociation temperature of the gaseous semiconductor compound, and the rate of precipitation must be kept as slight as feasible.

The above-described method according to the invention affords the production of semiconductor devices, particularly tunnel diodes, in which the dope concentration and hence resistance in the path regions, formed by the base layer and the further layers, can be adjusted independently of the doping in the p-n junction zone constituted by the two thin layers. By contrast, in the production of a p-n junction by alloying the dope concentration and resistance of the path regions is predetermined by the alloying pellet being used.

The invention will be further described with reference to the production of a tunnel diode by means of the processing equipment exemplified on the accompanying drawings in which:

FIG. 1 is a vertical sectional view of a pyrolytic processing apparatus.

FIG. 2 is a cross section along the line II—II in FIG. 1.

Figure 3:
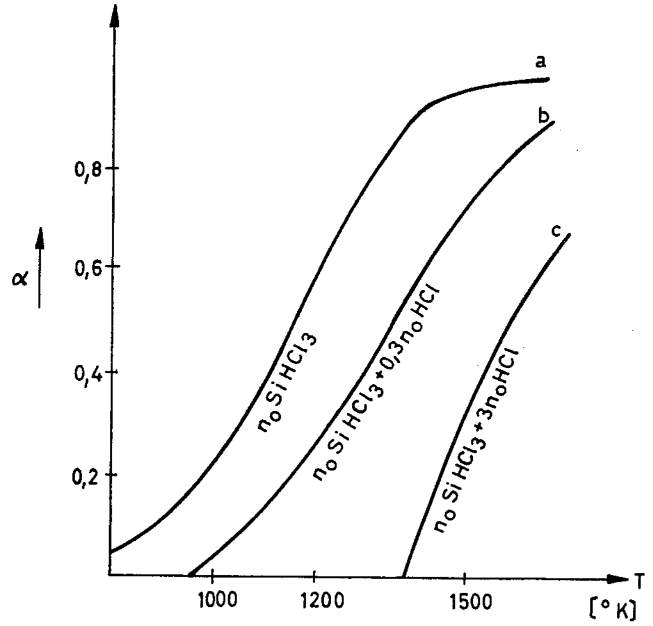
FIG. 3 is an explanatory graph.
Figure 4:
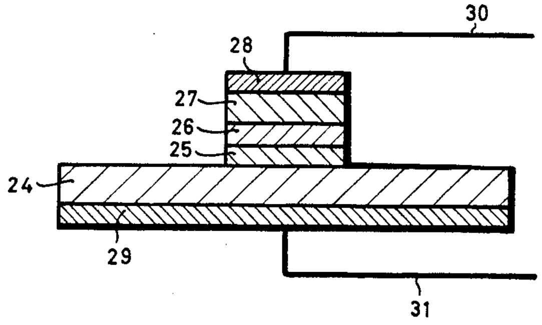
FIG. 4 shows schematically and in section a tunnel diode made according to the invention.

The apparatus shown in FIGS. 1 and 2 comprises a reaction vessel 3 of glass or quartz in which a flat carrier body 1 of monocrystalline silicon is mounted on a supporting block 4 which consists of a material, for example monocrystalline semiconductor material, from which during processing no impurities can diffuse into the carrier body 1. A high-frequency coil 2 surrounds the reaction vessel for inductively heating the carrier body 1 to the processing temperature above incandescence but below the melting point of the carrier body.

The carrier body 1 may also be heated conductively from its support 4 if the latter is heated accordingly, or the carrier body 1 may be provided with current supply leads to be heated up to pyrolytic temperature by passing electric current directly through the body. The coil 2 can then be used, for example, for pre-heating purposes.

The reaction-gax mixture is supplied through a pipe 5. In the processing example described hereinafter, the reaction gas consists of a silicon halogenide, silicochloroform ($SiHCl_3$), mixed with hydrogen. The residual gases are discharged through an outlet pipe 6. The inlet pipe 5 can be closed by means of a valve 8. Another inlet pipe 7 permits supplying a further gas, for example, hydrogen.

Prior to pyrolytic processing, the carrier body 1 is subjected to etching or polishing treatment and then placed into the reaction vessel and heated while valve 8 is kept closed. In this manner the carrier body is highly purified by vaporization or atomization (spattering) in high vacuum or in a suitable protective gas atmosphere, for example hydrogen, which is supplied through the inlet pipe 7. Thereafter the carrier body 1 is heated up to a temperature of about 1100° C., while the valve 8 is open and the reaction gas mixture is being passed through the processing vessel, entering through pipe 5 and discharging in spent condition through the pipe 6, with pipe 7 being shut off. In this manner a base layer is precipitated upon the flat carrier body 1 up to a relatively large thickness, for example larger than the diffusion length of the minority-charge carriers, and with a doping above the lower limit of degenerative density. The doping substance cannot be introduced into the reaction vessel through pipe 5 together with the reaction gas mixture but is supplied from a separate supply chamber or duct 9 located relatively close to the carrier body 1. Preferably, a turbulence mixer is inserted between the carrier body and the supply location at 9 for the gaseous doping substance or a gaseous compound of the doping substance. The turbulence mixer, shown composed of a number of slat-like baffle plates 10, 21, 22, 23 of angular shape, secures a good mixing of the reaction gas with the gaseous doping substance. The gaseous mixture then flows about the carrier body 1 in turbulent condition which promotes monocrystal formation.

The relatively thick base layer which, for example, is doped for n-type conductance, is grown to a thickness greater than the diffusion length of the minority carriers at a growing rate of approximately 200 A. per second. Thereafter a second layer is precipitated onto the base layer up to a thickness of about 20 to 100 A. The thin second layer has the same type of conductance as the base layer. The lattice defect (dope) concentration is likewise above the limit of degeneration, but the lattice-defect density is smaller than in the base layer and amounts to approximately $5 \cdot 10^{19}/cm.^3$. This layer of smaller thickness can be precipitated at a lower rate of growth. This is obtained by changing the composition of the reaction gas mixture and/or by reducing the surface temperature of the carrier, for example, down to 1000° C. The composition of the reaction gas mixture can be changed in the desired manner either by a further addition of hydrogen or by addition of a compound which displaces the reaction equilibrium, for example, hydrochloride (HCl).

The just-mentioned addition of a compound which displaces the reaction equilibrium in the pyrolytic precipitation of semiconductor material from the gaseous phase, is in accordance with the method described in the copending application of E. Sirtl, Serial No. 81,602, filed January 9, 1961, now Patent No. 3,162,797 and assigned to the assignee of the present invention. FIG. 2 of the drawing accompanying the present disclosure illustrates, in analogy to FIG. 1 of the copending application, the silicon quantity precipitated per unit of time, and hence the rate $\alpha$ of precipitation, in dependence upon the surface temperature T of the carrier body in degree Kelvin. The curve *a* corresponds to a reaction gas mixture consisting of 95 mole percent hydrogen and 5 mole percent silicon-tetrachloride ($n_0$). When adding 1.5 mole percent hydrogen chloride ($0.3n_0$) to this reaction gas mixture, the curve *b* will result. An addition of 15 mole percent of HCl ($3n_0$) results in curve *c*. The diagram of FIG. 2 shows that the rate of precipitation at a given pyrolytic temperature of the carrier body, for example 1100° C., is greatly reduced, or the pyrolytic precipitation is interrupted, by adding to the reaction gas mixture a compound that displaces the reaction equilibrium temperature. By additionally reducing the surface temperature of the carrier, for example, down to 1000° C., the rate of precipitaiton and growth can be further diminished. After growing the second layer, the growing process is interrupted, for example, by adding a corresponding quantity of an equilibrium-displacing compound. It is further of advantage to slightly remove part of the last grown layer in the following manner.

Curves *b* and *c* in the diagram of FIG. 2 indicate that when a reaction gas mixture contains an addition of hydrogen chloride (HCl), an only slight reduction in temperature causes an appreciable reduction in rate of precipitation which, in contrast to curve *a*, can be continued down to the zero value (no precipitation) and to negative values (removal of previously precipitated material). Reduction of temperature thus permits stopping the pyrolytic precipitation or removing by vaporization some of the previously precipitated substance. An interruption of the growing or precipitating process of the last-grown layer can also be obtained at a constant surface temperature of the carrier by adding a corresponding quantity of hydrochloride to the reaction gas mixture, or both means of interrupting the precipitating operation may be employed simultaneously.

After interruption of the growing process and, if desired, after partially reducing the thickness of the last-grown layer, a third layer of about 20 to 100 A. thickness is precipitated, this layer having the opposite conductance type, in the present example therefore p-type conductance. The surface temperature of a carrier during this stage of processing is 1000° C. The desired layer of 100 A. thickness is precipitated in about one second. The lattice-defect density is again at about $5 \cdot 10^{19}/cm.^3$. The reverse doping of n-type to p-type conductance occurs impactwise. That is, the supply of dope for the second and third layers, occurring each within a very short interval of time, can no longer be kept separated by means of valves, including those of the fast-switching types. For that reason, the doping substances are placed upon helical heater wires that are kept at low temperature and are suddenly heated by a surge of current to instantaneously evaporate the doping substances.

For this purpose the dope-supply portions 9 and 15 of the apparatus are provided with helical electric heater wires 12 and 11, respectively, upon which the doping acceptors and donors, respectively, are deposited. These portions 9 and 15 are provided with cooling jackets 13, 14 and are connected with respective current sources 19, 20 through normally open switches 17 and 18. By closing each heater circuit, the corresponding helical heater, carrying donor or acceptor substance, is impactwise heated to such a high temperature that the doping substance evaporates suddenly.

When the third layer is completed and the precipitation interrupted in the above-described manner, another p-type layer is precipitated within a period of about two seconds. In analogy to the above-mentioned base layer the additional layer is given a higher dope concentration than the third layer but is of the same conductance type. The thickness of the fourth layer, obtained within about two seconds, is approximately 2,000 A. During precipitation of the fourth layer, the surface temperature of the carrier is kept as low as feasible, i.e., at about 950° C. to prevent reverse diffusion. Simultaneously, the rate of growth is kept as large as feasible by changing the composition of the reaction gas mixture, and hence either by a corresponding choice of the hydrogen quantity added or of the hydrogen halide compound, such as HCl, that displaces the reaction equilibrium temperature. It is preferable to adjust the rate of growth for the fourth layer so that it is closely below the rate at which oversaturation of the carrier with semiconductor material takes place. It has been found that when the reduction of free semiconductor material exceeds a given value, dependent particularly upon the starting substances and the surface temperature of the carrier body, the surface of the carrier can no longer absorb the precipitated material in entirely monocrystalline form, so that the material is partly precipitated in polycrystalline constitution. Such oversaturation must be avoided. When using silicon tetrachloride and/or silicon chloroform as starting compounds and employing a carrier surface temperature of about 950° C., the rate of precipitation should be chosen at a value of at most 10 mg./h. $cm.^2$. It has also been found advisable, when precipitating the four layers, particularly during precipitation of the second and third layers, to preheat the reaction gas mixture and to keep the flow velocity of the reaction gas mixture as high as feasible, for example at 20 cm./second, so that the reaction gas mixture reaches the carrier within fractions of a second.

The n-doping of the layers can be obtained, for example by means of phosphorus, and the p-doping by means of boron, for example. The doping of the base layer and of the fourth (top) layer can be effected by adding to the reaction gas mixture a gaseous compound of the doping substance, such as one of the dope halides $BCl_3$, $BBr_3$, $PCl_3$ and $PBr_3$, for example. When using a hydrogen compound of the semiconductor substance, for example, $SiH_4$ or $GeH_4$, the compound of the doping substance consists preferably also of a hydrogen compound which possesses a suitably low dissociation temperature, such as $PH_3$, $AsH_3$ or $B_2H_6$. However, the thick layers may also be doped in the same manner as the thin layers, namely by vaporizing the doping substance from an electric heater such as those denoted by 11 and 12.

As mentioned, a reverse diffusion and hence flattening of the p-n junction is prevented to a great extent when performing the method according to the invention. For example, at 960° C. the diffusion constant for the doping substances, such as boron or phosphorus, being used, are in the order of $10^{-14}$ $cm.^2$/second. Under such conditions, the pyrolytic processing during two seconds causes a back diffusion down to the half-value concentration at a depth of about 14 A.

After terminating the growing process described above, the base layer and the last-grown top layer are provided with a recombination-poor contact by vaporizing a metal onto the free surfaces of the two outer layers.

A tunnel diode produced in accordance with the above-described example possesses an extremely slight capacitance by virtue of the slight doping of the thin second and third layers, whereas simultaneously a low resistance in the current path regions is obtained due to the high doping of the relatively thick base and top layers.

The method can also be performed with a large-area carrier body in sheet form and the deposited layers can thereafter be subdivided into individual semiconductor devices. One way of effecting such subdivision is to mask areas, for example, of about $50\mu^2$ at the desired distance from each other. The remaining portion of the device is then etched away, down to the base layer. The mesas thus formed are then separated by severing the base layer into individual semiconductor devices.

FIG. 3 shows schematically an embodiment of a tunnel diode made according to the above-described method. The layers 24, 25, 26 and 27 were produced in accordance with the invention by precipitation and growth from the gaseous phase, as described above. By etching down to the base layer 24, the mesa-type design of the device is obtained. Denoted by 28 and 29 are the metal electrodes which may be vapor-deposited upon the base layer 24 and the top layer 27. Electric leads 30, 31 are connected to the respective electrodes. As explained, the base layer 24 and the top layer 27 have a higher lattice-defect density than the second layer 25 and the third layer 26. The layers 24 and 25, for example, are doped for n-type conductance and the layers 26 and 27 are then p-doped. The second layer 25 and the third layer 26 form the extremely narrow p-n junction of the tunnel diode.

The above-mentioned interruption of the pyrolytic precipitation between the growth of the two mutually adjacent layers of respectively different conductance type may be in the order of seconds or minutes, depending upon the particular equipment being used, it being only necessary for the interruption to satisfy the condition described presently. For producing the p-n junction, the reaction gas must be given an admixture of a doping substance differing from the one added to the same reaction gas prior to forming the p-n junction. The quantity of doping substance added to the reaction gas determines the dope concentration of the semi-conductor material being precipitated. The p-n junction to be produced would be most abrupt if the change in dope addition to the reaction gas were completely performed instantaneously. Such a sudden change, however, is infeasible because some amount of time is necessary for uniformly filling the processing vessel with the reaction gas that contains the new doping substance, and fully eliminating from the reaction gas the residues of the doping substance previously employed. For this reason, the precipitating operation during production of the p-n junction by the method according to the invention, is interrupted for such an interval of time as is required to fully eliminate the reaction gas with the previous dope content from the reaction vessel, and to substitute it by the reaction gas to which the new dope substance is admixed. During this change in gaseous atmosphere, the carrier upon which the precipitation is effected, is kept at a temperature below the melting point of the semiconductor material to prevent melting of the previously precipitated material.

In the above-described example, only the thin layers 25 and 26 of semiconductor material form the p-n junction and constitute the tunnel diode proper. The thicker semiconductor layers 24 and 27 serve essentially as carriers for the thin layers and facilitate contacting the thin layers with electrode material. Electrically, therefore, each of the thick layers 24 and 27 essentially constitutes a series-connected resistance with respect to the tunnel diode proper, no p-n junction being located between the thick layers 24, 27 and the respective thin layers 25, 26. Consequently, the thick layers are to be dimensioned so that they secure sufficient mechanical strength of the tunnel diode but do not impair the electric functioning of the thin layers. For this reason, the thick layers should be as little polycrystalline as feasible and should preferably be monocrystalline. On the other hand, they are to possess lowest possible electric resistance. For the latter reason, it is preferable, as set forth above, to give the thicker carrier layers 24 and 27 highest permissible dope concentration.

It is to be taken into account, however, that silicon, germanium and gallium arsenide, as well as other semiconductor substances, form homogeneous crystal systems with the usually employed doping substances only if the mixing ratio is within the solubility range of the added dope substance. The above-mentioned value or $5\cdot10^{19}$ dope atoms per $cm.^3$ in the junction-forming thin layers 25 and 26 is rather close to the limit of soluibility above which, for thermodynamic reasons, the formation of a homogeneous crystal is no longer possible. The solubility limit for phosphorus and boron in germanium and silicon is somewhat higher than $10^{20}$ boron or phosphorus atoms per $cm.^3$. If this solubility limit is exceeded, the semiconductor material precipitated from the gaseous phase is no longer monocrystalline. For that reason, if the thin silicon or germanium layers were precipitated upon thick layers doped far beyond the solubility limit, noticeable departures from the most desirable monocrystalline structure would occur, despite the fact that the doping of the thin layers, as they are being precipitated, remains below the solubility limit. Since the electric quality of a tunnel diode is the better the more perfect the crystal structure of the junction-forming thin layers is, it is preferable to take care that at least the crystal structure of the first precipitated thick layer 24 is such that the thin layers precipitated thereupon are monocrystalline. For that reason, although for the purpose of high electric conductors in the thick layer a high doping degree in the thick layers is aimed at, the dope concentration should not, or only slightly, be raised beyond the solubility limit.

While the invention has been described above with particular reference to silicon, it is analogously applicable to other semiconductor materials, for example, germanium, or the III–V semiconductor compounds according to Welker U.S. Patent 2,798,989.

We claim:

1. In the process of producing four-layer semiconductor p-n junction devices, which comprises passing into a reaction vessel a gaseous compound of a semiconductor substance in mixture with a pyrolytically inert gas over a carrier body of the same substance heated to pyrolytic temperature for precipitating said substance onto said carrier body, the improvement comprising the steps of sequentially precipitating a first thin layer of the same conductance type and of a lesser dope density than said carrier body, thereafter precipitating on said first thin layer a second thin layer of the same dope concentration as said first thin layer but of opposed conductance type, said first thin layer and said second thin layer having a thickness not larger than about 500 angstroms but larger than the thickness of the diffusion zone which during precipitation is counterdoped up to the half-concentration of the majority-charge carriers, interrupting the pyrolytic reaction between precipitation of respective layers for an interval of time so as to substantially remove the reaction gas dope content for the first of said two layers from the reaction vessel; and sequentially precipitating another layer adjacent to said second thin layer, said other layer having at least ten times the thickness of said adjacent second thin layer and consisting of the same semiconductor substance, said other thick layer having the same conductance type as said second thin layer but a greater dope density than said second thin layer.

2. The pyrolytic process of producing semiconductor junction devices according to claim 1, comprising the step of reducing the temperature of said carrier body to a value sufficiently low to interrupt the pyrolytic reaction between the respective growing periods of said two adjacent layers.

3. The pyrolytic process of producing semiconductor junction devices according to claim 1, comprising the step of changing the composition of the reaction gas mixture by adding to the gas mixture a component selected from the group consisting of hydrogen and hydrogen halide to thereby interrupt the pyrolytic reaction between the resective growing periods of said two adjacent layers.

4. In the process of producing four layer semiconductor p-n junction devices which comprises passing into a reaction vessel a gaseous compound of the semiconductor substance in mixture with a pyrolytically inert gas over a carrier body of the same substance heated to pyrolytic temperature for precipitating said substance onto said carrier body, the improvement comprising the steps of thus sequentially precipitating at least two adjacent thin layers of about the same dope concentration but mutually opposed conductance types having a layer thickness not larger than about 500 angstrom but larger than the thickness of the diffusion zone which during precipitation is counterdoped up to the half-concentration of the majority charge carriers; and reducing the temperature of said carrier body and simultaneously changing the composition of the reaction gas mixture by adding a gas selected from the group consisting of hydrogen and hydrogen halide between the respective growing periods of said sequential layers to thereby temporarily interrupt the pyrolytic reaction and thereafter precipitating another layer adjacent to one of said two thin layers, said other layer having at least about ten times the thickness of said adjacent thin layer and consisting of the same semiconductor substance, said thick layer having the same conductance type as the adjacent thin layer but a greater dope density than said thin layers.

5. The pyrolytic process of producing semiconductor junction devices according to claim 1, wherein said semiconductor substance is selected from the group consisting of germanium and silicon, and wherein the dope concentration in said thin layers is at least about $10^{19}$ atoms per cubic centimeter and up to the limit of solubility.

6. In the pyrolytic process of producing semiconductor p-n junctions according to claim 1, the step of precipitating another layer adjacent to one of said two thin layers, said other layer having greater thickness than each of said thin layers and consisting of the same semiconductor substance and having the same conductance type as the next-adjacent thin layer but greater dope density than the latter; and adjusting the carrier temperature to about 950° C. and gas mixture during precipitation of said thick layer to a precipitation rate of about 10 mg./h. cm.$^2$, which is closely below the oversaturation limit of said carrier.

7. In the pyrolytic process of producing semiconductor p-n junctions according to claim 1, the step of precipitating upon the last-precipitated thin layer a thicker top layer of the same semiconductor substance as said thin layers and having the same conductance type as said last-precipitated thin layer but a greater dope density than said thin layers, maintaining said pyrolytic temperature at a reduced value during precipitation of said layer and simultaneously maintaining said reaction-gas mixture at a changed precipitation-rate increasing composition.

8. The pyrolytic process of producing semiconductor junction devices according to claim 1, comprising the step of changing the composition of the reaction-gas mixture by adding thereto a reaction-equilibrium displacing compound to thereby interrupt the pyrolytic reaction between the respective growing periods of said two adjacent layers.

9. In the pyrolytic process of producing semiconductor junction devices according to claim 1 wherein the carrier body is mounted in a reaction vessel, the step of passing the reaction-gas mixture through the vessel and along the carrier body at a rate of about 20 cm. per second.

10. In the process of producing four layer semiconductor p-n junction devices which comprises passing a gaseous compound of the semiconductor substance in mixture with a pyrolytically inert gas over a carrier body of the same semiconductor substance heated to pyrolytic temperature in a reaction vessel for precipitating said substance onto said carrier body, the improvement comprising the steps of sequentially adding and admixing to the gas mixture two respective dope substances at a locality within said vessel and near said carrier body and thus sequentially precipitating onto said carrier body two mutually adjacent thin layers of respectively different conductance types but substantially the same dope concentration between about $10^{19}$ atoms per cm.$^3$ and the limit of solubility, terminating the precipitation of each layer when it attains a thickness of at most about 500 angstrom but larger than the thickness of the diffusion zone which during precipitation becomes counterdoped up to the half-concentration of the majority charge carriers and precipitating another layer adjacent to one of said two thin layers, said other layer having at least about ten times the thickness of said adjacent thin layer and consisting of the same semiconductor substance, said thick layer having the same conductance type as the adjacent thin layer but a greater dope density than said thin layers.

11. The pyrolytic process of producing semiconductor junction devices according to claim 10, wherein said dope substances are mixed with the reaction-gas mixture by a turbulence mixer in said vessel.

12. In the pyrolytic process of producing semiconductor junction devices according to claim 10, the step of depositing the dope substance on a normally inactive electric heater in said vessel, and applying a surge of current to said heater to suddenly evaporate the dope substance therefrom.

13. In the process of producing four layer semiconductor p-n junction devices, which comprises passing a gaseous halogen compound of the semiconductor substance in mixture with hydrogen over a carrier body of the same semiconductor substance heated to a pyrolytic dissociation temperature for precipitating said substance onto said carrier body, the improvement comprising the steps of adding to said gaseous mixture a hydrogen compound of said semiconductor substance, said hydrogen compound having a lower pyrolytic dissociation temperature than said halogen compound to promote formation of a steep p-n junction; sequentially admixing to the mixture two dope substances and thereby sequentially precipitating into said carrier body two mutually adjacent thin layers of respectively different conductance types but substantially the same dope concentration between about $10^{19}$ atoms per cm.$^3$ and the limit of solubility, terminating the precipitation of each layer when it attains a thickness of at most about 500 angstorm but larger than the thickness of the diffusion zone which during precipitation becomes counterdoped up to the half-concentration of the majority charge carriers and precipitating another layer adjacent to one of said two thin layers, said other layer having at least about ten times the thickness of said adjacent thin layer and consisting of the same semiconductor substance, said thick layer having the same conductance type as the adjacent thin layer but a greater dope density than said thin layers.

14. In the pyrolytic process of producing semiconductor junction devices according to claim 1, the steps of using a sheet-like carrier body of an area corresponding to a multiplicity of junction devices to be produced; masking individual partial areas on the device upon completion of the pyrolytic precipitation of said layers; etching the layers away at the exposed intermediate areas to produce a multiplicity of mesas; and then severing the body into individual mesa-type devices.

(References on following page)

References Cited by the Examiner

UNITED STATES PATENTS

| | | | |
|---|---|---|---|
| 2,702,523 | 2/55 | Prestwood et al. | 118—48 |
| 2,763,581 | 9/56 | Freedman | 148—1.5 |
| 2,817,311 | 12/57 | Nack | 118—48 |
| 2,879,188 | 3/59 | Strull | 148—1.5 |
| 2,895,858 | 7/59 | Sangster | 148—1.5 |
| 2,909,453 | 10/59 | Tosco et al. | 148—1.5 |
| 2,944,321 | 7/60 | Westberg | 148—1.5 X |
| 3,014,820 | 12/61 | Marinace et al. | 148—1.5 |
| 3,089,794 | 5/63 | Marinace | 148—15 |

FOREIGN PATENTS

| | | |
|---|---|---|
| 1,029,941 | 5/58 | Germany. |

OTHER REFERENCES

Dewitt et al.: "Transistor Electronics," McGraw-Hill Book Co., Inc., New York, 1957, pp. 66 to 70.

Loonan: "Principles and Applications of the Iodide Process," Journal of the Electrochemical Society, vol. 106, No. 3, March 1959, pp. 238–244.

DAVID L. RECK, *Primary Examiner.*

RAY K. WINDHAM, *Examiner.*